United States Patent
Sahoo (10) Patent No.: US 6,822,919 B2
(45) Date of Patent: Nov. 23, 2004

(54) SINGLE ENDED OUTPUT SENSE AMPLIFIER CIRCUIT WITH REDUCED POWER CONSUMPTION AND NOISE

(75) Inventor: Naren K. Sahoo, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 63 days.

(21) Appl. No.: 10/190,917

(22) Filed: Jul. 8, 2002

(65) Prior Publication Data

US 2004/0004881 A1 Jan. 8, 2004

(51) Int. Cl.[7] .............................. G11C 7/02; G11C 7/10; G11C 7/12
(52) U.S. Cl. .................. 365/208; 365/189.05; 365/203; 365/196
(58) Field of Search ................................ 365/208, 207, 365/189.05, 203, 196

(56) References Cited

U.S. PATENT DOCUMENTS

| | | | |
|---|---|---|---|
| 4,894,803 A | * 1/1990 | Aizaki | 365/189.05 |
| 5,473,567 A | 12/1995 | McClure | 365/208 |
| 5,487,048 A | 1/1996 | McClure | 365/207 |
| 5,619,456 A | 4/1997 | McClure | 365/189.05 |
| 5,619,466 A | 4/1997 | McClure | 365/207 |
| 5,864,696 A | 1/1999 | McClure | 395/557 |
| 5,986,967 A | * 11/1999 | Furumochi et al. | 365/233 |

* cited by examiner

Primary Examiner—Van Thu Nguyen
Assistant Examiner—J. H. Hur
(74) Attorney, Agent, or Firm—Lisa K. Jorgenson; Christopher F. Regan (57) ABSTRACT

A sense amplifier circuit for a memory cell includes a sense amplifier that is operable to be coupled to a memory cell via data lines, and including read bus complement and read bus true lines operative with a data output through which a data output signal is passed. An equalization circuit and enable circuit are operable with the sense amplifier. A control circuit is operable for disconnecting the data output from preferably the one of the read bus complement line and minimize unwanted transitions on the data output signal.

18 Claims, 6 Drawing Sheets

SINGLE ENDED OUTPUT SENSE AMPLIFIER CIRCUIT WITH REDUCED POWER CONSUMPTION AND NOISE

FIELD OF THE INVENTION

This invention relates to sense amplifier circuits used in memory circuits, and more particularly, this invention relates to a sense amplifier circuits having a global data-bus line and reduced power consumption and noise.

BACKGROUND OF THE INVENTION

Sense amplifiers are often used in static random access memories (SCRAM) and other types of memories during the Read operation of data from a memory cell. The memory cells are etched onto silicon wafers in bit lines formed of columns and word lines formed as rows. The intersection of a bit line and word line form an address of the memory cell. During a write operation, a row line contains a charge that the capacitor/transistor should take to place a value at the address corresponding to a "1" or "0". When reading, a sense amplifier determines the level of charge of the particular address. For example, if the charge is greater than 50% of a normal charge, the sense amplifier reads a "1." Otherwise, the sense amplifier reads the charge as a "0". A controller and counter tracks a refresh sequence based on the rows that have been accessed in a particular order.

In one type of sense amplifier circuit, the differential voltage produced by a memory cell is amplified by a sense amplifier and fed through a single line output driver, for example, a global data-bus line (GDB) such as disclosed in commonly assigned U.S. Pat. No. 5,619,466, the disclosure which is hereby incorporated by reference in its entirety.

In that type of sense amplifier circuit, a sense amplifier is coupled to a memory cell via data lines and amplifies the data. The circuit includes a read bus complement (RBC) and read bus true (RBT) line. An equalizer circuit is coupled to the sense amplifier and operable to receive an equalization signal to equalize the sense amplifier. An enable circuit is coupled to the sense amplifier and operable to receive an enable signal to enable the sense amplifier to amplify data.

During a read operation, the read bus complement and read bus true lines are equalized by a sense amplifier equalization (SAEQB) signal that is generated by an internal equalization control circuit during an equalization phase of operation. During this equalization phase, a sense amplifier enable (SAEN) signal is generated by an enable circuit at a "low" value such that the cross-coupled transistors forming the sense amplifier are not activated. After the read bus complement and read bus true lines are properly equalized, the sense amplifier equalization (SAEQB) line turns "high" corresponding to Vcc. One of the read buses, i.e., the read bus complement or read bus true, will be pulled towards ground or "low" by the memory cell. After proper development of the differential in the read bus complement and read bus true line, the sense equalization enable signal goes "high," turning "ON" the cross-coupled transistor structure forming the sense amplifier and further pulling down the particular read bus and increasing the voltage differential between the read bus complement and read bus true line, reducing access time. This can create an extra and unnecessary transition during the equalization phase, increasing the power consumption of the overall sense amplifier circuit.

SUMMARY OF THE INVENTION

It is therefore an object of the present invention to control the data output of a sense amplifier circuit as described above during the equalization phase to reduce unnecessary transitions at the data output.

The present invention advantageously provides a sense amplifier circuit for a memory cell that includes a sense amplifier that is operable to be coupled to a memory cell via data lines and operable to amplify data. It includes read bus complement and read bus true lines and a data output for outputting a data output signal. An equalization circuit is coupled to the sense amplifier and operable to receive an equalization signal to equalize the sense amplifier. An enable circuit is coupled to the sense amplifier and operable to receive an enable signal to enable the sense amplifier to amplify data. A control circuit is operable for disconnecting the data output from one of the read bus complement or read bus true lines and minimize unwanted transitions on the data output signal.

In one aspect of the present invention, the control circuit comprises a latch circuit that stores data when an enable signal comprises a low signal. It could be formed by at least one passgate circuit that is turned on and off by an enable signal. In yet another aspect of the present invention, the latch circuit is formed as first and second passgate circuits and first and second feedback circuits. The first latch circuit is off when the second latch circuit is on. The control circuit is operable from the enable circuit, in yet another aspect of the present invention. The control circuit can be operable for disconnecting the data output from the read bus complement line whenever there is an equalization. The data output preferably comprises a single line data output such as a global data-bus (GDB) line. The sense amplifier is formed as a pair of cross-coupled transistors of the type known to those skilled in the art.

A method aspect of the invention controls a sense amplifier circuit and comprises the steps of equalizing a sense amplifier with an equalization signal and disconnecting the data output from one of the read bus complement or read bus true lines during the equalization phase of the sense amplifier. An enabling signal is provided for enabling the sense amplifier. The data output can be disconnected from the read bus complement line. In yet another aspect of the present invention, the data output is disconnected from a control circuit that is operative with a line drive circuit through which the data output signal is passed. The data output can comprise a global data-bus line.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
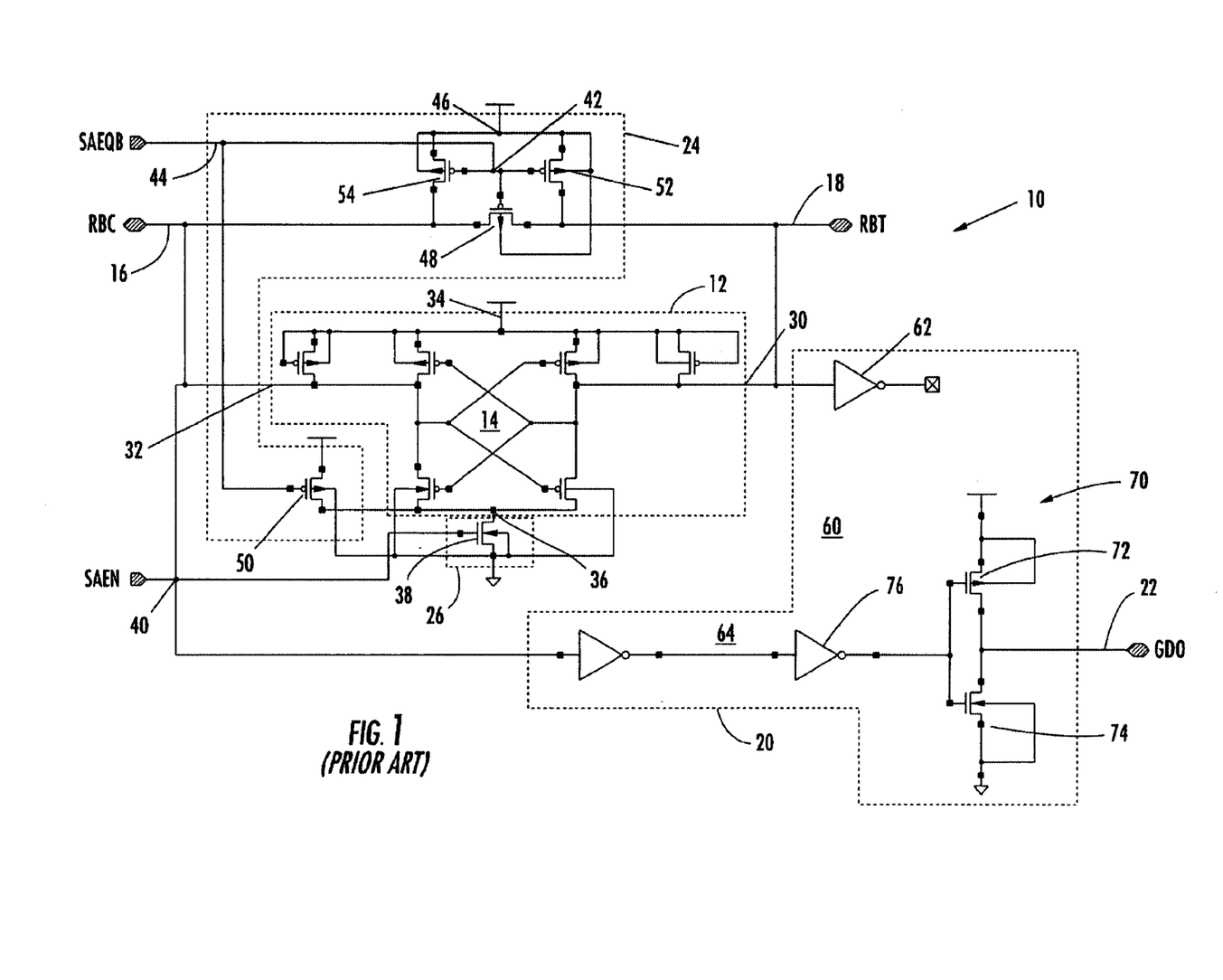
FIG. 1 is a schematic circuit diagram of a prior art sense amplifier circuit for a memory cell that includes a sense amplifier, equalization circuit and enable circuit.

Typically sense amplifiers are used in Static Random Access Memories (SRAM) and also other types of memories during the Read operation of a data from memory cell. The differential voltage produced by the memory cell is amplified by the sense amplifier circuit and fed to the output driver as a data-line drive. A sense amplifier circuit is shown in FIG. 1, which illustrates a schematic circuit diagram of the prior art sense amplifier circuit 10, including the data-line driver 12 as an output driver shown in dashed lines. A similar circuit and its function and operation is disclosed in commonly assigned U.S. Pat. No. 5,619,466, the disclosure which is hereby incorporated by reference in its entirety.

The sense amplifier circuit 10 includes basic components, such as a sense amplifier 12 shown in dashed lines and including cross-coupled transistors (M6, M8, M9 and M10) 14 and operable to be coupled to a memory cell via data lines and operable to amplify data. This sense amplifier circuit 10 includes read bus complement and read bus true lines 16,18. These lines are operably connected to a data-line drive 20 as an output driver and having a global data-bus line (GDB) 22 through which amplified data is output. The sense amplifier circuit 10 also includes an equalization circuit 24 and an enable circuit 26, both shown by dashed lines. The data-line drive 20 includes various inverters and a pair of output transistors as will be described in greater detail below.

For purposes of background description, some of the circuit function, as set forth in the incorporated by reference '466 patent, is described below relative to the general description of the sense amplifier circuit shown in FIG. 1.

The sense amplifier circuit 10 includes the sense amplifier 12, which has a first input terminal 30 coupled to the RBT line 18, and a second input terminal 32 coupled to the RBC line 16. The sense amplifier 12 includes a first power terminal 34 coupled to Vcc, and a second power terminal 36. The enable circuit 26 includes a transistor circuit 38 and has a control terminal coupled to SAEN via the input terminal 40. A pair of switch terminals are coupled between the power terminal 36 and ground. The equalization circuit 24 has an equalize terminal 42 coupled to SAEQ via the terminal 44. The equalization circuit 24 is also coupled to Vcc via a power-supply terminal 46. The equalization circuit 24 includes a first equalization switch 48, which has a control terminal coupled to SAEQ and a switchable path coupled between the RBC line 16 and the RBT line 18. A second equalization switch 50 has a control terminal coupled to SAEQ and a switchable path coupled between Vcc and the second power terminal 36 of the sense amplifier 12. A third equalization switch 52 has a control terminal coupled to SAEQ and a switchable path coupled between Vcc and the RBT line 18. A fourth equalization switch 54 has a control terminal coupled to SAEQ and a switchable path coupled between Vcc and the RBC line 16.

In operation, before either a write or a read cycle, SAEQ is active low to cause the equalization circuit 24 to equalize the sense amplifier 12 by coupling together and to Vcc the RBC and RBT lines 16 and 18.

At the beginning of a read cycle, SAEQ goes inactive high to cease the precharging of the sense amplifier 12, and SAEN goes active high to enable the sense amplifier 12 by coupling the power terminal 36 to ground. The sense amplifier 12 then amplifies the data signals initially occupying the RBC and RBT lines 16 and 18 to give full-signal data values on these lines. For example, depending upon the value of data stored in the memory cell that is read, the sense amplifier 12 drives one of the RBC and RBT lines 16 and 18 to a logic 0, and the other of the RBT and RBC lines 16 and 18 to a logic 1. The amplified data value is coupled to the data-line driver 20 via the RBC and RBT lines 16 and 18. During a write cycle, known sense amplifier circuits often draw supply current from the power supply even when the sense amplifier 12 is disabled.

In known sense amplifier circuits, the switch 50 has its control terminal coupled to SAEN. With such a configuration, and with Vcc coupled to one of the lines 16 and 18 and approximately 1.5 volts coupled to the other of the lines 16 and 18, the sense amplifier 12 may draw a supply current through the switch 50 and through the one of the cross-coupled N-channel transistors having its gate coupled to the line 16 and 18 carrying Vcc. Furthermore, in known sense amplifier circuits, SAEQ is normally active low during a write cycle to maintain the sense amplifier 12 in an equalized state.

In one technical feature as discussed in the '466 patent, the sense amplifier circuit 10, and more specifically the sense amplifier 12, draws substantially no current from the power supply during a write cycle in which a memory block associated with the sense amplifier 12 is selected. As state above, Vcc occupies one of the lines 16 and 18, and a body-effected transistor threshold voltage occupies the other of the lines 16 and 18.

The data-line driver 20 includes an input stage 60, which includes a first inverter circuit 62 which could be formed as a first pair of totem-pole coupled transistors (not shown), which have their gates coupled to the RBT line 18 via an input terminal. The input stage 60 also includes a second inverter circuit stage 64 which could be formed as a second pair of totem-pole coupled transistors, which have their gates coupled to the RBC line 16 via an input terminal and other circuit components suggested to those skilled in the art.

This data line drive could include other circuit components, such as disclosed in the '466 patent, with circuit modifications, such as an enable circuit having a switch and has a control terminal coupled to SAEN via an enable terminal, and has a switchable path coupled between Vcc and a power-distribution node. The enable circuit may also include a first switch having its control terminal coupled to SAEN and having a switchable path coupled between the output terminal of a transistor pair and ground, and a second switch having its control terminal coupled to SAEN and a switchable path coupled between the output terminal of a transistor pair and ground.

An output stage 70 includes the pair of output drive transistors 72 and 74, and has a first input terminal that is coupled to the output terminal of the inverters. The input terminal is coupled via an inverter 76 to the gates of transistors 72, 74.

During read operation, RBC and RBT are equalized by SAEQB (Sense Amplifier Equalization) signal being generated by the equalization circuit 24 that acts as a control circuit. This phase is called the equalization phase. During this phase, SAEN (Sense Amplifier Enable) signal is "Low" so that cross coupled transistors (M6, M8, M9, M10) 14 are not activated. After RBC and RBT are properly equalized, SAEQB turn "HIGH" (VCC). Now one of Read buses (RBC or RBT) will be pulled towards ground (LOW) by the memory cell (not shown). After proper development of differential in "RBC" and "RBT," SAEN goes HIGH turning ON the cross-coupled transistor structure further pulling down the low going Read bus, thus increasing the voltage differential between RBC and RBT, thus reducing access time.

Figure 2:
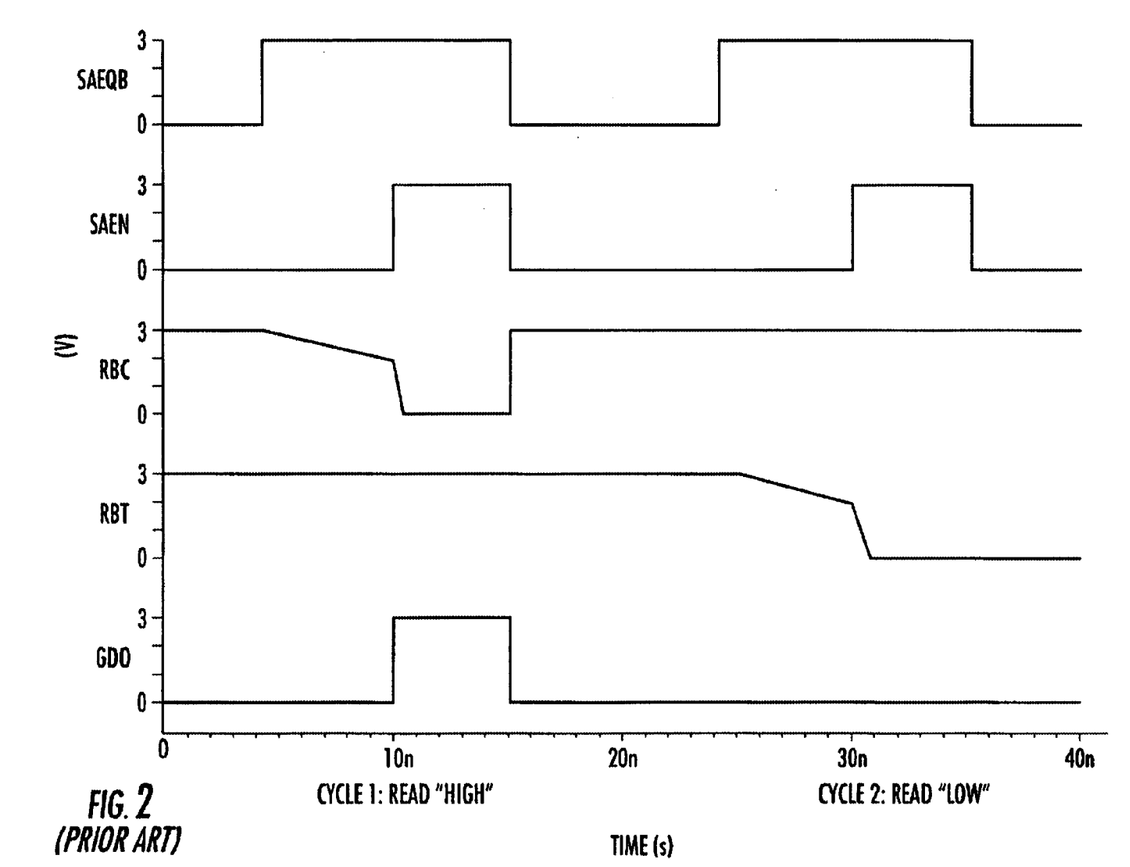
FIG. 2 is a graph showing the transient response of the sense amplifier circuit shown in FIG. 1 where a read "high" is followed by a read "low".

In FIG. 2, a transient response graph is illustrated showing the read "HIGH" in cycle 1 and read "LOW" in cycle 2. After the first read cycle, when the sense amplifier circuit enters the equalization phase, RBC and RBT are equalized, thus forcing the data output signal (GDO) to become "LOW." During cycle 2, when the sense amplifier circuit reads a "LOW," the GDO stays LOW.

Figure 3:
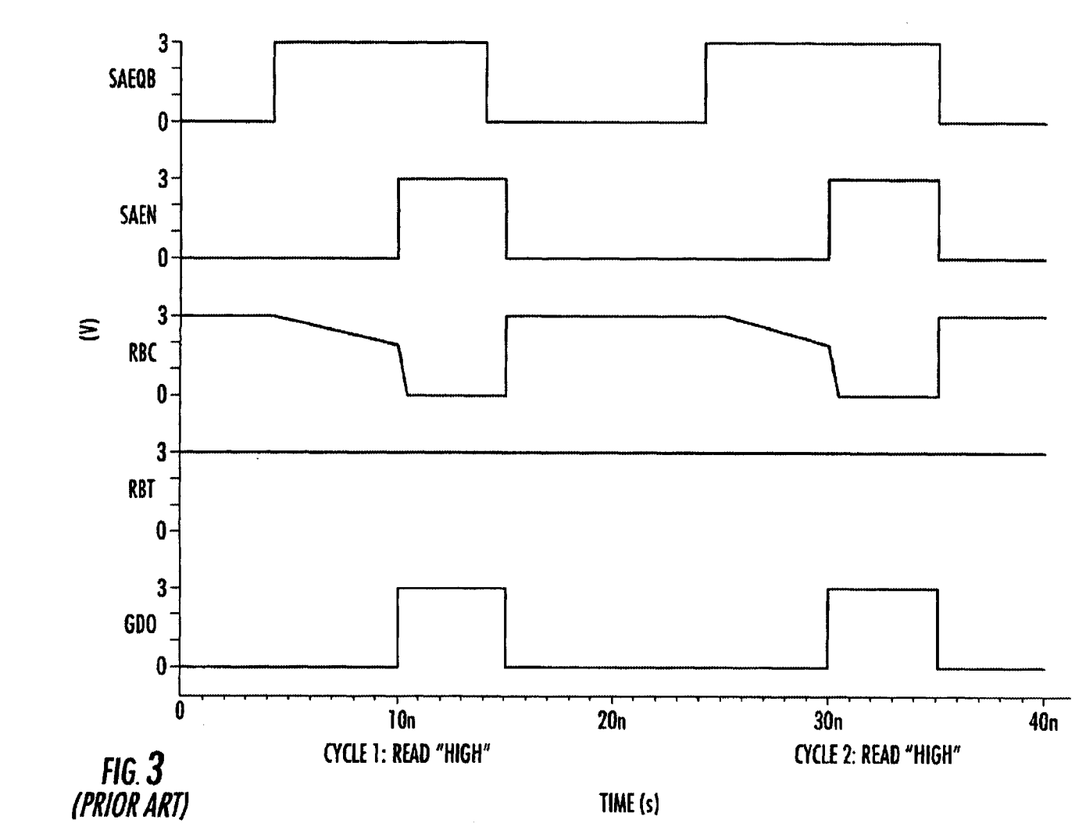
FIG. 3 is a graph showing the transient response for the sense amplifier circuit shown in FIG. 1 where a read "high" is followed by a read "high".

In FIG. 3, there is illustrated a graph showing that the sense amplifier circuit 10 reads "HIGH" in cycle 1 and again reads "HIGH" in cycle 2. After the first read cycle (read "HIGH"), as the sense amplifier circuit enters an equalization phase, GDO turns "LOW." During cycle 2, when the sense amplifier circuit starts reading a "HIGH," GDO 22 again switches to HIGH, thus creating an extra unnecessary transition during the equalization phase, which increases the power consumption of the sense amplifier circuit.

Figure 4:
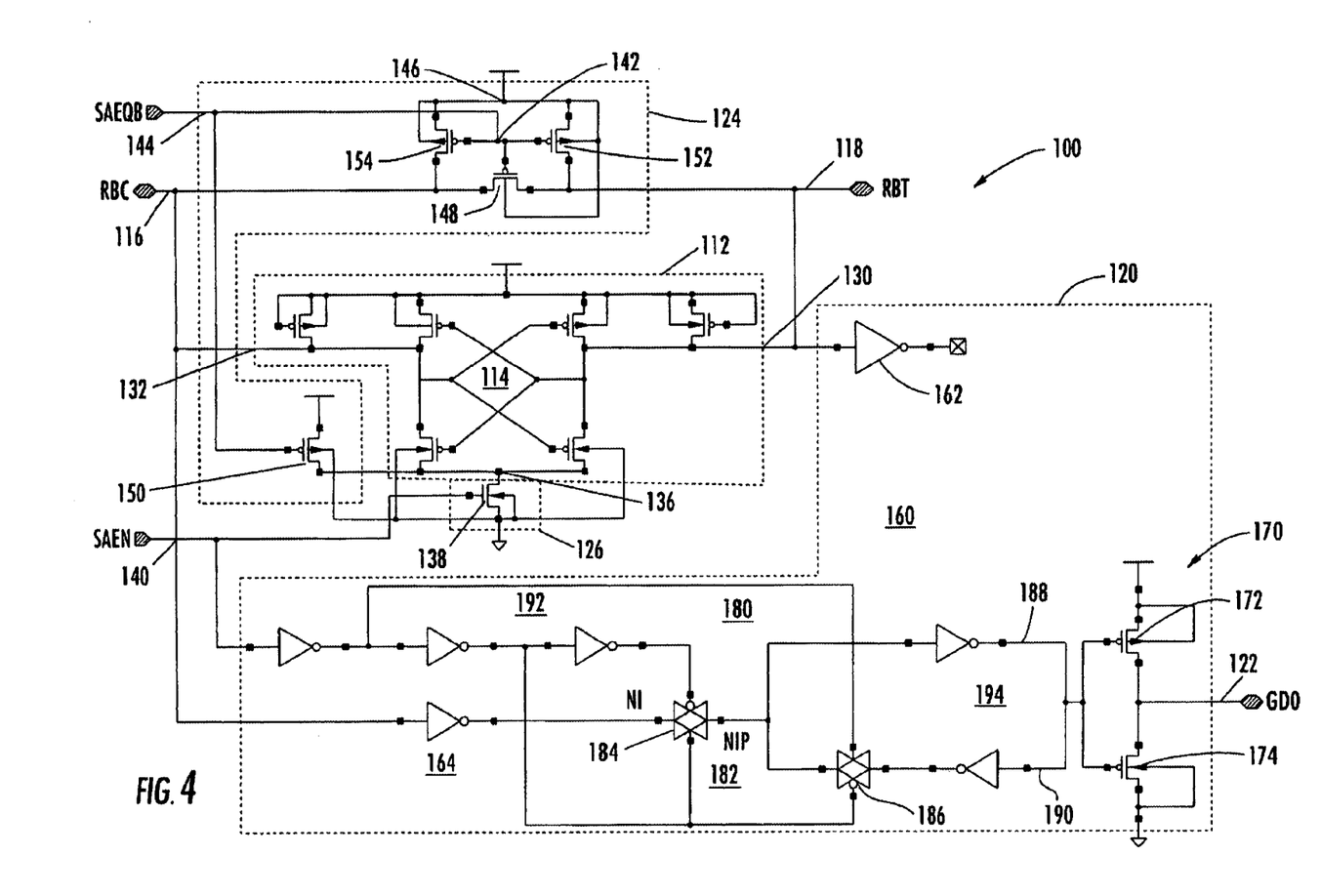
FIG. 4 is a schematic circuit diagram of the sense amplifier circuit in accordance with the present invention and showing a control circuit as part of the line drive circuit used for minimizing unwanted transitions on the data output.

The improved sense amplifier circuit 100 of he present invention is shown in FIG. 4. Many of the circuit components, such as the enable circuit 126, equalization circuit 124 and sense amplifier 112 with the cross-coupled transistors 114, are similar in structure and have similar reference numerals except they are recited in the 100 series for differentiation. The line driver circuit 120 includes the output transistors 172, 174, but also includes a control circuit 180 that is operable as part of the data-line drive 120 and disconnects the global data-bus line 122 from one of the read bus complement and read bus true lines and preferably the read bus complement line 116 when the sense amplifier is equalized to minimize unwanted transitions on the data output signal. This control circuit 180 includes a latch circuit 182 that stores data when an enable signal comprises a low signal and is formed by at least one passgate circuit that is turned on and off by an enable signal. In the preferred aspect of the invention shown in FIG. 4, the latch circuit 182 is formed as first and second passgate circuits 184, 186 and first and second feedback circuits 188, 190, and a serial inverter circuit 192, and parallel coupled inverter circuit 19 coupled to the second passgate 186 and output transistors 172, 174. The first passgate circuit 184 is off when the second passgate circuit 186 is on. The passgates form nodes N1P and N1 as illustrated. The passgates are listed as I12 and I14 and feedback circuits I10 and I11.

Figure 5:
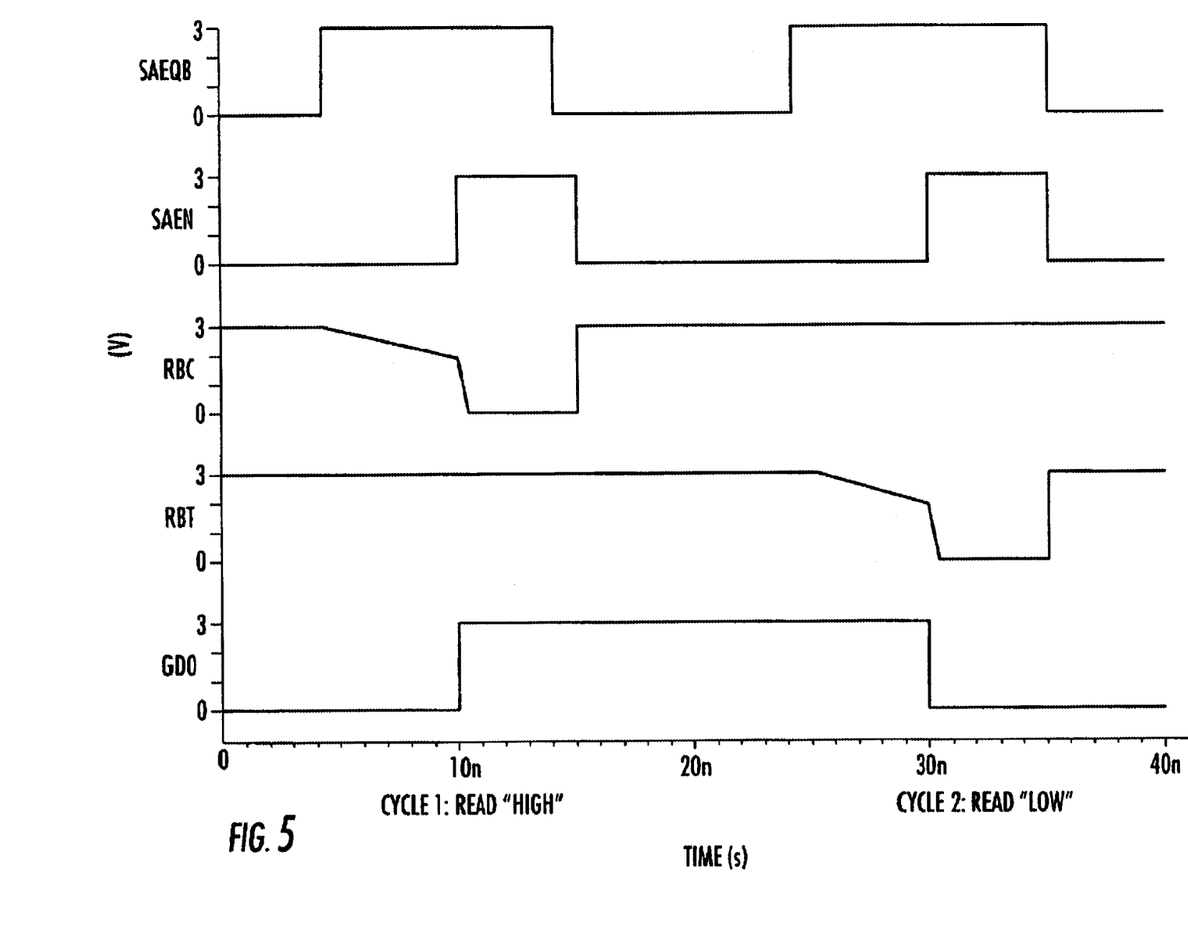
FIG. 5 is a graph showing the transient response of the sense amplifier circuit of the present invention shown in FIG. 4 and showing a read "high" followed by a read "low."
Figure 6:
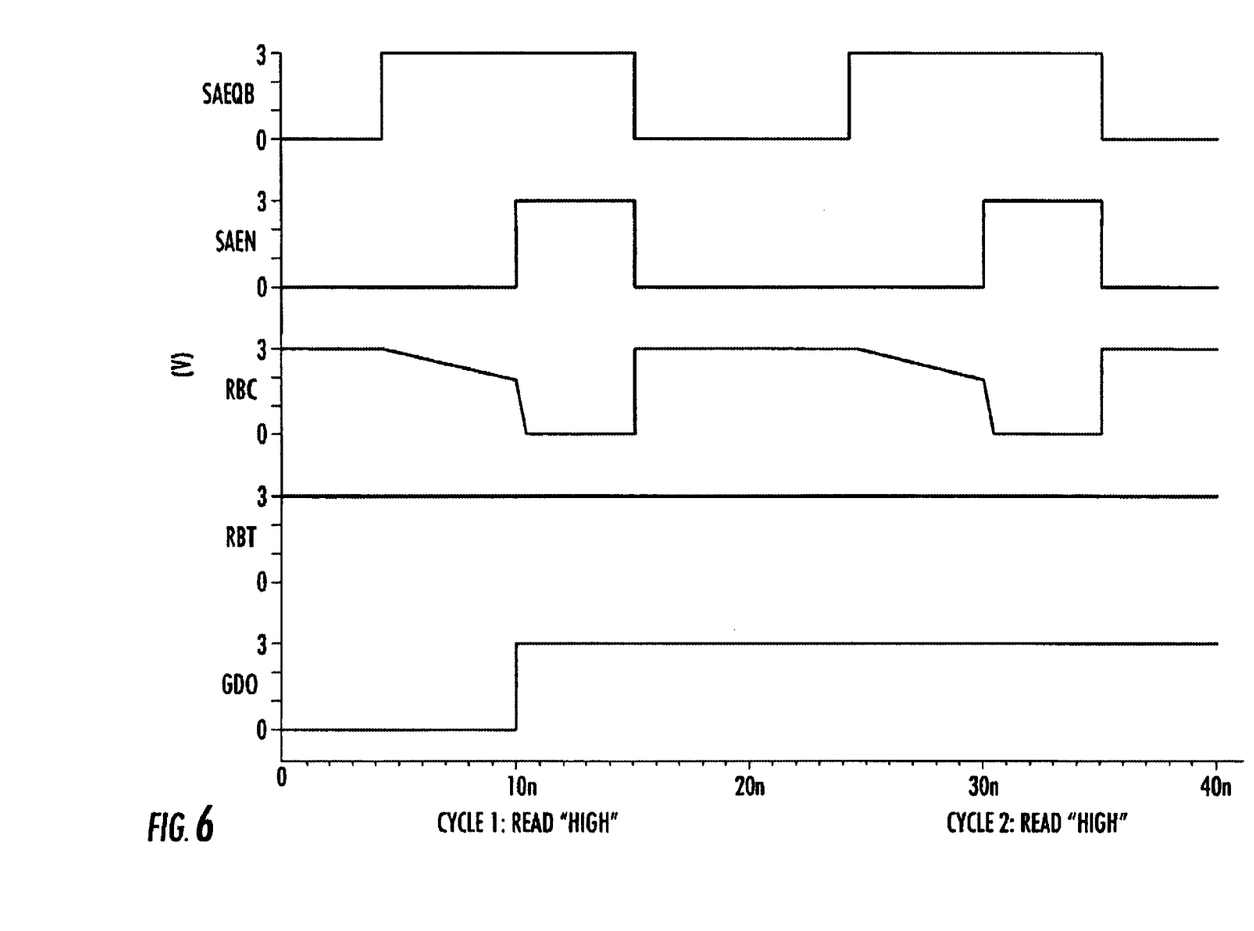
FIG. 6 is a graph showing the transient response for the sense amplifier circuit shown in FIG. 4 of the present invention and showing a read "high" followed by a read "high."

Here, the SAEN signal is operable with the control circuit, which disconnects RBC fed to the line driver of GDO directly during the equalization phase. In FIG. 5, a transient response graph is illustrated and shows a see read "HIGH" in cycle 1 and a read "LOW" in cycle 2 for new SA. In FIG. 6, the graph illustrates the read "HIGH" in cycle 1 and read "HIGH" in cycle 2. During equalization phase, the GDO starts at the same polarity as was during the previous cycle, in effect reducing one extra transition of GDO, which saves power (the output drivers do not switch), and reduces noise (talk transition).

Similar phenomenon occurs during a write followed by a read cycle. During the write phase, RBC and RBT are equalized (as was in equalization phase) forcing GDO to "LOW," which is unnecessary. This is avoided in the improved sense amplifier circuit shown in FIG. 4, as node 'N1P' is disconnected from node "N1" by the passgate 184, hence removing the false transition of GDO. During following the read cycle, the passgate 184 will be turned ON which in effect connects RBC to GDO through output driver. The turning ON and OFF of passgate 184, which is controlled by SAEN, can be critical in some instances. The timings are adjusted by the control circuit so that there is enough time to develop good differential in RBC and RBT before sense amplifier is turned ON. At the same time, the passgate does not turn ON earlier, in which case false RBC signal might sneak in into the output driver. In the improved sense amplifier circuit, the latch is built (by passgates 184 and 186, and feedback circuits 188 and 190) which stores the data even if SAEN goes "LOW" turning OFF passgate 184. This latch ensures that data is always driven onto GDO 122. During equalization or WRITE phase when SAEN becomes LOW, N1 and N1P are disconnected which prevents passage of unwanted transition of N1 onto GDO.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A sense amplifier circuit for a memory cell comprising:
a sense amplifier operable to be coupled to a memory cell via data lines and operable to amplify data, and further comprising read bus complement and read bus true lines and a data-line drive having a global data-bus line (GDB) and data output and coupled to the sense amplifier and operable to couple amplified data as a data output signal on the global data-bus line during a read cycle, and operatively connected to at least one of said read bus complement and read bus true lines through which a data output signal is output;
an equalization circuit coupled to the sense amplifier and operable to receive an equalization signal to equalize the sense amplifier;
an enable circuit coupled to the sense amplifier and operable to receive an enable signal to enable the sense amplifier to amplify data; and
a control circuit operable for disconnecting the output from one of the read bus complement and read bus true lines when the sense amplifier is equalized to minimize unwanted transitions of the data output signal, said control circuit including a latch circuit that stores data when the enable signal is LOW and ensures that data is always drive onto the global data-bus line and data output, wherein during equalization or WRITE phase when the enable signal becomes LOW, the latch circuit is disconnected and prevents passage of unwanted transition of the latch circuit onto the data output of the global data-bus line.

2. A sense amplifier according to claim 1, wherein said control circuit is operable for disconnecting the data output from said read bus complement line.

3. A sense amplifier circuit according to claim 1, wherein said latch circuit comprises at least one passgate circuit that is turn on and off by said enable signal.

4. A sense amplifier circuit according to claim 3, wherein said latch circuit comprises a first and second passgate circuits and first and second feedback circuits.

5. A sense amplifier circuit according to claim 4, wherein said first passgate circuit is off when said second passgate circuit is on.

6. A sense amplifier circuit according to claim 1, wherein said control circuit is operable from said enable circuit.

7. A sense amplifier circuit according to claim 1, wherein said sense amplifier comprises pairs of cross-coupled transistors.

8. A sense amplifier circuit for a memory cell comprising:
a sense amplifier operable to be coupled to a memory cell via data lines and operable to amplify data, and further comprising read bus complement and read bus true lines;
an equalization circuit coupled to the sense amplifier and operable to receive an equalization signal to equalize the sense amplifier;
an enable circuit coupled to the sense amplifier and operable to receive an enable signal to enable the sense amplifier to amplify data; and
a data-line drive having a global data-bus line (GDB) through which data is output and coupled to said sense amplifier and operable to couple amplified data as a data output signal on the global data-bus line during a read cycle, and further comprising a control circuit operable with said data-line drive for disconnecting the global data-bus line from one of the read bus complement and read bus true lines when the sense amplifier is equalized to minimize unwanted transitions on the data output signal, said control circuit including a latch circuit that stores data when the enable signal is LOW and ensures that data is always driven onto the global data-bus line and data output, wherein during equalization or WRITE phase when the enable signal becomes LOW, the latch circuit is disconnected and prevents passage of unwanted transition of the latch circuit onto the data output of the global data-bus line.

9. A sense amplifier according to claim 8, wherein said control circuit is operable for disconnecting the global data-bus line from said read bus complement line.

10. A sense amplifier circuit according to claim 8, wherein said latch circuit comprises at least one passgate circuit that is turned on and off by said enable signal.

11. A sense amplifier circuit according to claim 10, wherein said latch circuit comprises a first and second passgate circuits and first and second feedback circuits.

12. A sense amplifier circuit according to claim 11, wherein said first passgate circuit is off when said second passgate circuit is on.

13. A sense amplifier circuit according to claim 8, wherein said control circuit is operable from said enable circuit.

14. A sense amplifier circuit according to claim 8, wherein said sense amplifier comprises pairs of cross-coupled transistors.

15. A sense amplifier circuit for a memory cell comprising:
a sense amplifier operable to be coupled to a memory cell via data lines and operable to amplify data, and further comprising read bus complement and read bus true lines and a data-line drive having a global data-bus line (GDB) and data output and coupled to the sense amplifier and operable to couple amplified data as a data output signal on the global data-bus line during a read cycle, and operatively connected to at least one of said read bus complement and read bus true lines for outputting a data output signal; and
a control circuit operable for disconnecting the data output from one of the read bus complement and read bus true lines when the sense amplifier is equalized to minimize unwanted transitions of the data output signal, said control circuit including a latch circuit that stores data when the enable signal is LOW and ensures that data is always driven onto the global data-bus line and data output, wherein during equalization or WRITE phase when the enable signal becomes LOW, the latch circuit is disconnected and prevents passage of unwanted transition of the latch circuit onto the data output of the global data-bus line.

16. A sense amplifier circuit according to claim 15, and further comprising an enable circuit coupled to the sense amplifier and operable to receive an enable signal to enable the sense amplifier to amplify data.

17. A method of controlling sense amplifier circuit comprising the steps of:
providing an enabling signal far enabling a sense amplifier;
equalizing the sense amplifier with an equalization signal, the sense amplifier having a read bus complement and read bus true lines and data-line drive having a global data-bus line (GDB) and data output and coupled to the sense amplifier and operable to couple amplified data as a data output signal on the global data-bus line during a read cycle, and operatively coupled thereto; and
disconnecting the data output from one of the read bus complement or read bus true lines during an equalization phase of the sense amplifier from a control circuit that includes a latch circuit that stores data when the enable signal is LOW and insures that data is always driven onto the global data-bus line and data output, wherein during equalization or WRITE phase when the enable signal becomes LOW, the latch circuit is disconnected and prevents passage of unwanted transition of the latch circuit onto the output of the global data-bus line.

18. A method according to claim 17, and further comprising the step of disconnecting the data output from the read bus complement line.

* * * * *